(12) United States Patent
Shifrin

(10) Patent No.: US 6,537,216 B1
(45) Date of Patent: Mar. 25, 2003

(54) TRANSMIT CIRCUIT FOR IMAGING WITH ULTRASOUND

(75) Inventor: Lazar A. Shifrin, San Jose, CA (US)

(73) Assignee: Acuson Corporation, Mountain View, CA (US)

( * ) Notice: Subject to any disclaimer, the term of this patent is extended or adjusted under 35 U.S.C. 154(b) by 127 days.

(21) Appl. No.: 09/846,942

(22) Filed: Apr. 30, 2001

(51) Int. Cl.⁷ .................................................. A61B 8/00
(52) U.S. Cl. ...................................................... 600/437
(58) Field of Search ............................... 600/437–440; 367/138; 330/271

(56) References Cited

U.S. PATENT DOCUMENTS

| | | | |
|---|---|---|---|
| 3,818,361 A | 6/1974 | Gonda | |
| 3,895,306 A | 7/1975 | Rebeles | |
| 3,919,655 A | 11/1975 | Crandall | |
| 4,555,672 A | 11/1985 | Segal | |
| 4,973,916 A | 11/1990 | Baik | |
| 5,103,188 A | 4/1992 | Bender | |
| 6,104,673 A | 8/2000 | Cole et al. | |
| 2002/0133094 A1 * | 9/2002 | Wilcox et al. | 600/587 |

OTHER PUBLICATIONS

"Implementation And Applications of Current Sources and Current Receivers" Burr–Braun IC Applications Handbook, L1–459, 1994.

\* cited by examiner

*Primary Examiner*—John A. Jeffery

(57) ABSTRACT

A digital-to-analog converter that outputs positive and negative portions of the desired bi-polar waveform as a representative unipolar waveform (e.g. absolute value of the bi-polar waveform) is connected to a switch. The switch selects between current driver paths as a function of the positive or negative polarity of the desired bi-polar waveform. The current drivers feed a push-pull output amplifier to generate the bi-polar ultrasound waveform. Alternatively, a digital-to-analog converter with differential outputs is connected to two difference amplifiers. The difference amplifiers provide current signals to the push-pull output amplifier through their supply nodes. A single scaling resistor connects between the conventional outputs of two differential amplifiers to reduce mismatching between the positive and negative waveform paths. As a result of the feedback between the two difference amplifiers, a lower level of even harmonic distortion products is achieved.

39 Claims, 5 Drawing Sheets

TRANSMIT CIRCUIT FOR IMAGING WITH ULTRASOUND

BACKGROUND

This invention relates to ultrasound transmit circuits. In particular, ultrasound transmit circuits for generating bi-polar ultrasound waveforms are provided.

For medical diagnostic ultrasound imaging, high current and high voltage amplifiers generate bi-polar waveforms. A wide bandwidth of operation of the amplifiers is used. However, operation of the transmit amplifiers may generate even order distortion products, i.e., such a components at a second harmonic or subharmonics of the fundamental frequency of the bi-polar waveform. The subharmonics generate undesirable echoes where an ultrasound system is designed to receive valuable subharmonic information generated by tissue.

Push-pull amplifiers have been used to reduce even order distortion in transmitted ultrasound waveforms. FIG. 1 shows a push-pull amplifier 100 disclosed in U.S. Pat. No. 3,895,306. The push-pull amplifier 100 includes two class A cascode amplifiers 102 and 104 connected in a push-pull relationship with an output transformer 106. Each cascode amplifier includes two transistors 108, 112 and 110, 114. Two transistors 108, 110 are connected in a common base configuration, and the other two transistors 112, 114 operate as common emitter stages.

A network 116 of resistors 124, 126, 138 and a capacitor 118 provides a feedback loop for the push-pull amplifier 100. The network 116 detects differences in the output of the two cascode amplifiers 102, 104 as a function of the current at the center tap 132 of the transformer 106. Any difference at the center tap 132 generates a voltage at the bases of the transistors 108, 110. The voltage is applied to the bases of the transistors 112 and 114 through the capacitor 118 to equalize the cascode amplifiers transfer function. The network 116 provides negative feedback, and the resistors 124, 126 and 138 establish a DC operating voltage. Two input sources 128, 130 provide a signal of the same amplitude but 180° out of phase to the cascode amplifiers 102, 104. An inductor 134 isolates the feedback path for the network 116 from a supply voltage 136.

Harmonic distortion produced by the two cascode amplifiers 102 and 104 are substantially identical when the fundamental output of the cascode amplifiers 102, 104 are of the same amplitude. The signals output by the cascode amplifiers 102, 104 are equal and opposite. Any even harmonics generated by the cascode amplifiers 102, 104 are cancelled in the output transformer 106. However, any difference in the fundamental waveforms generates a feedback signal. The feedback signal is in phase with respect to the branch with the lower output amplitude and out of phase for the branch with the higher output amplitude. The feedback signal tends to equalize the output of the two branches of the push-pull amplifier 100.

This push-pull amplifier 100 is a Class A amplifier. Class A amplifiers have high quiescent power dissipation, resulting in low efficiency. Higher efficiency is achieved by Class B amplification. For Class B amplification, each path provides output for alternate time periods. The positive and negative portions of the bi-polar waveform are separated for amplification. Consequently, harmonic distortions in a Class B amplifier cannot be cancelled by the feedback signal. To reduce these distortions, the two paths are matched in gain and phase.

A high efficiency linear transmit circuit for ultrasound diagnostic imaging is disclosed in U.S. Pat. No. 6,104,673 and is shown in FIG. 2. The transmit circuit 200 operates over a wide frequency bandwidth. The transmit circuit 200 includes a programmable waveform generator (PWG) 202, two digital-to-analog converters 210, 212, a respective pair of current amplifiers or drivers 214, 216 and an output amplifier 218. The output amplifier includes a pair of transistors 222 and 224, and a transformer 220.

The PWG 202 generates separate unipolar waveforms representing positive and negative portions of the desired bi-polar ultrasound waveform. One unipolar waveform is output on bus 206 to a digital-to-analog converter 212, and the other unipolar waveform is output on bus 208 to digital-to-analog converter 210. A sign bit is output on line 204 to enable operation of the digital-to-analog converters 210 and 212. The two transistors 222 and 224 are connected in a common gate configuration. An external voltage source 226 provides gate biasing. A center tap of the primary winding of the transformer 220 is tied to a high voltage power supply 228. Since the transmit circuit 200 includes two open loop signal paths for respective positive and negative portions of the bi-polar transmit waveform, the components in each path should be closely matched to avoid even harmonic distortion.

In order to transmit a waveform with a Gaussian envelope (FIG. 4A), the current-output DACs 210 and 212 are intended to produce a pair of signals shown in FIGS. 4B and 4C, respectively. Having ideally matched signal paths, transmit signal, U(t), is combined as the algebraic difference of positive, $U^+(t)$, and negative, $U^-(t)$, portions in accordance with:

$$U(t) = U^+(t) - U^-(t) \tag{1}$$

Assume further that there is a gain mismatch between the two signal paths, denoted as $\delta = \Delta G/G$. In such a case, a "distorted" transmit signal, $U_D(t)$, yields $$U_D(t) = U(t) + \delta[U^+(t) + U^-(t)] \tag{2}$$

The second term of Eq. 2 will produce even order distortion products. For instance, given the waveform with the Gaussian envelope, the resulting spectrum expands as shown in FIG. 4D.

In practice, the purity of a transmitted waveform is estimated with the Linear Response Rejection Ratio (LRRR). The LRRR is defined as the ratio of the energy under matched filters that are centered at fundamental and the second harmonic frequencies. For a Gaussian envelope, the LRRR can be easily computed. The obtained results (FIG. 4E) show that the prior art transmit cell 200 is quite sensitive to the gain mismatch. At this point, using a dual DAC topology has a significant drawback since the level of gain mismatch is twice as much higher. This is particularly meaningful because DACs, even high-resolution DACs, may have gain error up to few % of the full scale.

BRIEF SUMMARY

The present invention is defined by the following claims, and nothing in this section should be taken as a limitation on those claims. By way of introduction, the preferred embodiments described below include a method and system for generating a bi-polar ultrasound transmit waveform.

In one embodiment, a digital-to-analog converter that outputs positive and negative portions of the desired bi-polar waveform as a representative unipolar waveform (e.g. absolute value of the bi-polar waveform) is connected to a switch. The switch selects one of two current drivers as a function of the positive or negative polarity of the desired bi-polar waveform. The current drivers feed a push-pull output amplifier to generate the bi-polar ultrasound waveform.

In another embodiment, a digital-to-analog converter with differential outputs is connected to two difference amplifiers. The difference amplifiers provide current signals to the push-pull output amplifier for generating a desired bi-polar ultrasound waveform. A resistor connecting between the conventional outputs of two differential amplifiers specifies the voltage-to-current scaling factor for both amplifiers.. Employing a single resistor, both positive and negative portions of a waveform are uniformly processed.

In a first aspect, an ultrasound transmit circuit for generating a bi-polar waveform is provided. An output amplifier operatively connects with first and second current drivers. A digital-to-analog converter connects with a switch. The switch is operable to connect an ultrasound waveform output of the digital-to-analog converter with a selectable one of the first and second current drivers.

In a second aspect, a method for generating a bi-polar ultrasound waveform with an ultrasound transmit circuit is provided. A digital unipolar waveform representation of the bi-polar ultrasound waveform is converted to an analog waveform. Portions of the unipolar waveform representing respective positive and negative portions of the bi-polar ultrasound waveform are indicated. An output responsive to the conversion to an analog waveform is switched as a function of the indication.

In a third aspect, an ultrasound transmit circuit for generating a bi-polar waveform is provided. An output amplifier connects with first and second current drivers. A resistor connects between the first and second current drivers. An ultrasound transducer connects with the output amplifier.

In a fourth aspect, an ultrasound transmit circuit for generating a bi-polar waveform is provided. An output amplifier has first and second inputs connected with respective first and second supply nodes of first and second difference amplifiers. An ultrasound transducer connects with the output amplifier.

In a fifth aspect, a method for generating a bi-polar ultrasound waveform with an ultrasound transmit circuit is provided. An output amplifier is driven with first and second difference amplifiers. The supply current of the first and second difference amplifiers is scaled by a resistor connected between the first and second difference amplifiers. The bi-polar ultrasound waveform is generated by the output amplifier.

In a sixth aspect, a method for generating a bi-polar ultrasound waveform with an ultrasound transmit circuit is provided. Two complimentary waveforms are amplified. The amplified current is obtained from first and second difference amplifiers. A bi-polar ultrasound waveform is generated in response to the amplification.

Further aspects and advantages of the invention are discussed below in conjunction with the preferred embodiments.

DETAILED DESCRIPTION OF THE PREFERRED EMBODIMENTS

Several embodiments provide reduced level of harmonic distortion for class B ultrasound amplifiers. In a first embodiment, a single digital-to-analog converter is used to avoid inaccuracies associated with different full-scale amplitudes caused by separate digital-to-analog converters for each path. A switch connects the output of the digital-to-analog converter to one of two current drivers for driving a Class B amplifier. The current drivers include amplifiers with feedback, allowing control of current gain in the current driver.

In a second embodiment, a single digital-to-analog converter with a differential output connects with two difference amplifiers. Supply nodes of the differential amplifiers drive a Class B output amplifier. A resistor connects between the conventional outputs of the two differential amplifiers for uniform scaling the two paths, avoiding generation of harmonic distortion.

Both embodiments provide broadband high power ultrasound transmit amplifiers effective for reducing even order distortion. Arbitrary waveforms may be amplified by this low cost circuitry. Initial balancing of circuits is avoided. The circuit topology minimizes gain and phase mismatch between two signal paths driving the push-pull output amplifier. Different load impedances may also be connected without generating harmonic distortion.

Figure 2:
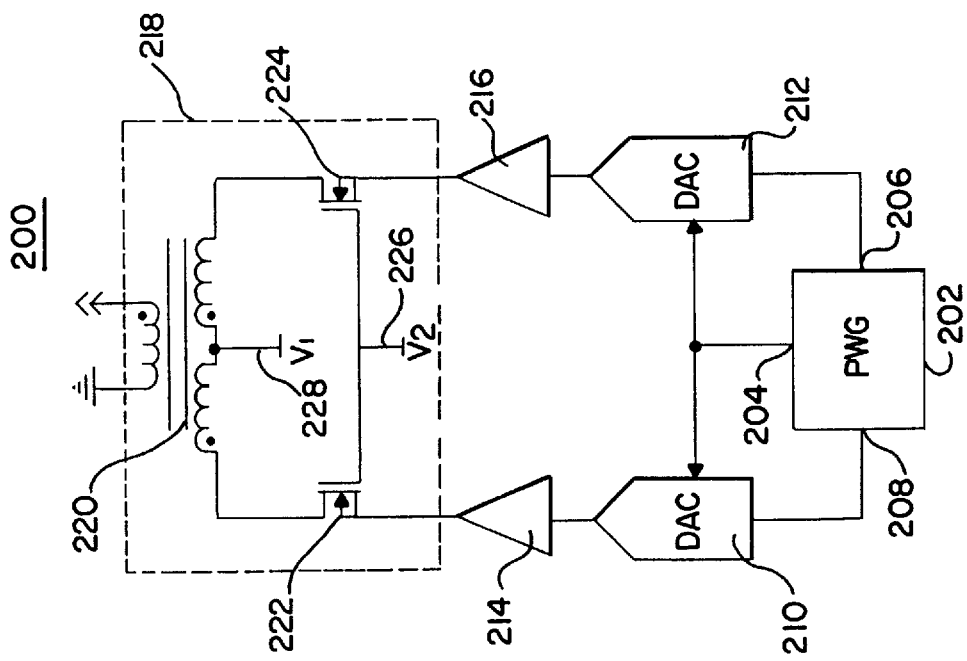
FIG. 2 is a circuit diagram of a Class B amplifier used for an ultrasound transmit circuit.
Figure 1:
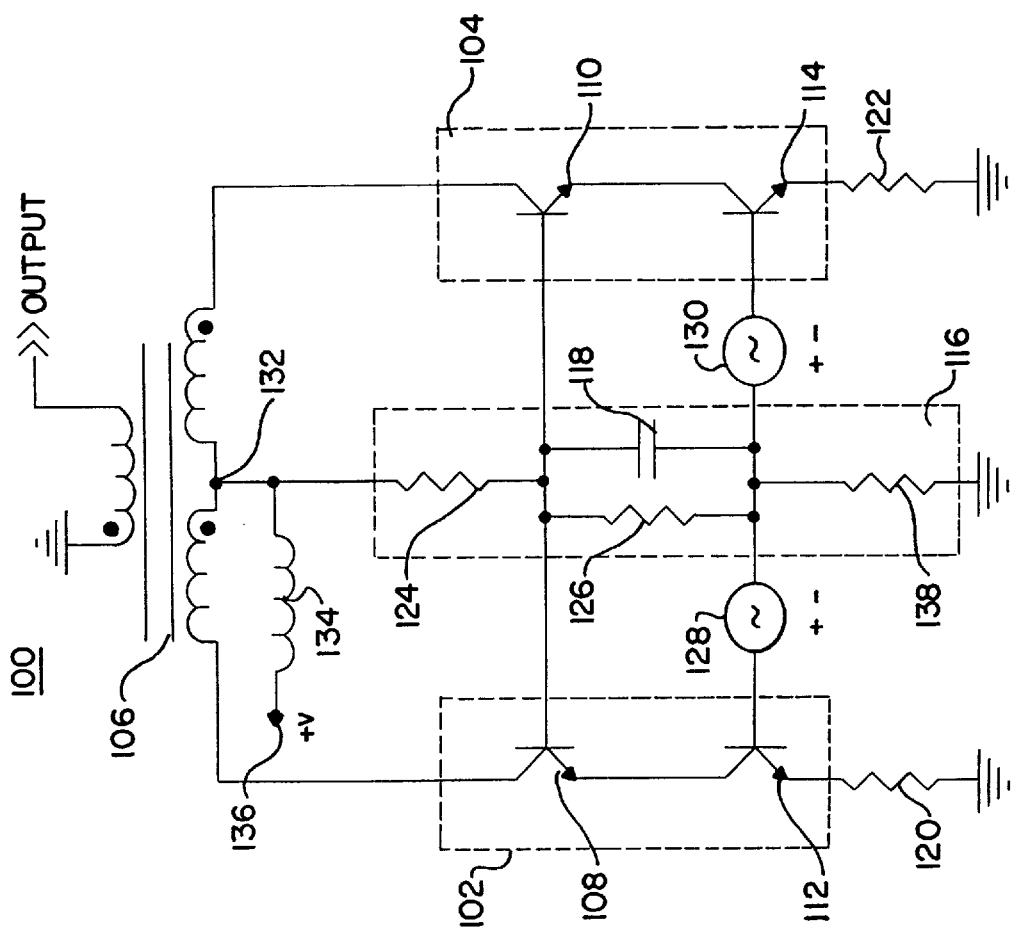
FIG. 1 is a block diagram of a Class A amplifier used for an ultrasound transmit circuit.
Figure 3:
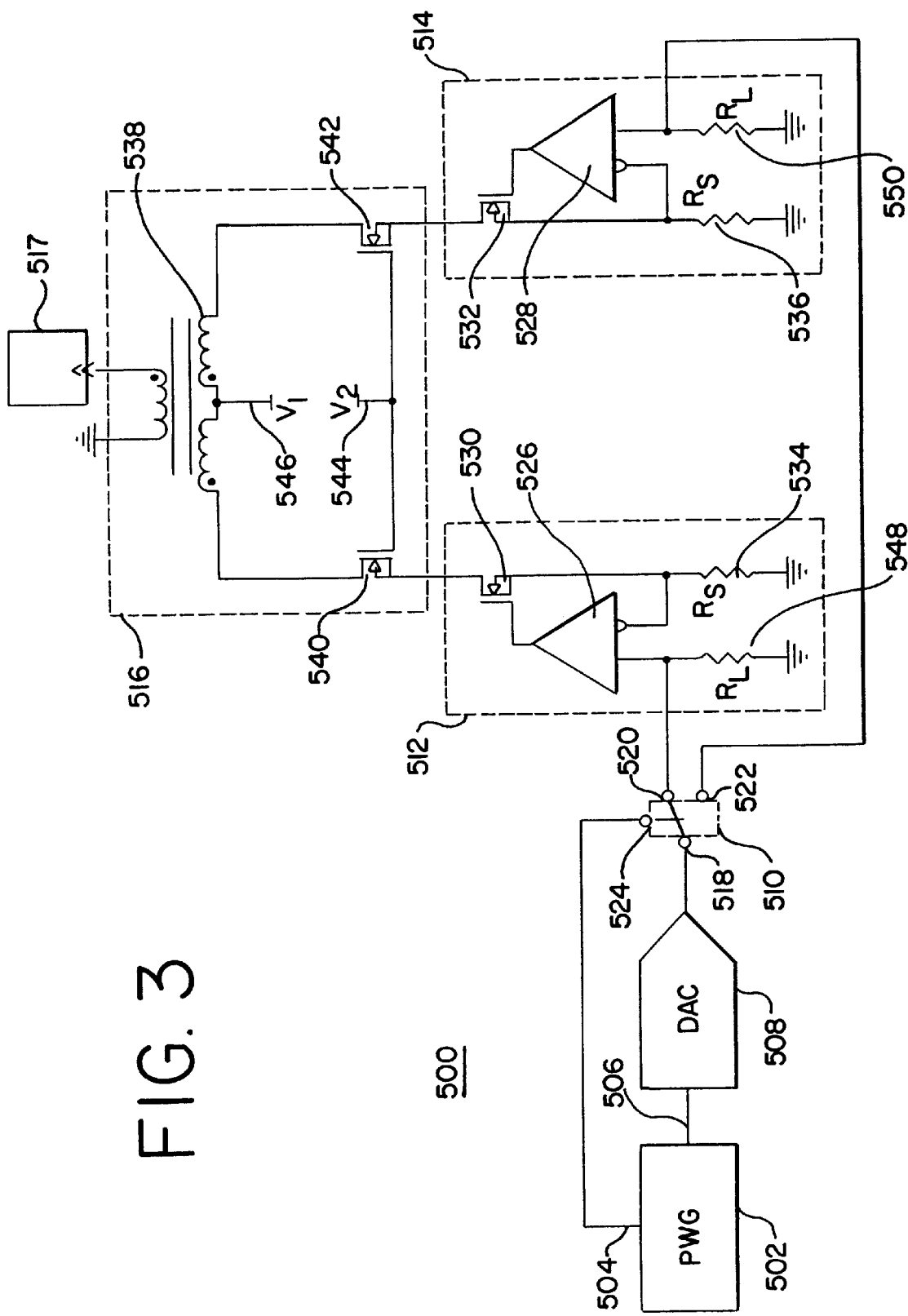
FIG. 3 is a circuit diagram of one embodiment of an ultrasound transmit circuit.

FIG. 3 shows one embodiment, an ultrasound transmit circuit 500 using a switch 510. In one embodiment, the ultrasound transmit circuit 500 is used for medical diagnostic ultrasound imaging. The ultrasound transmit circuit 500 includes a programmable waveform generator (PWG) 502, a digital-to-analog converter (DAC) 508, the switch 510, first and second current drivers 512, 514, an output amplifier 516 and a transducer element 517. Additional, fewer or different components may be used.

The PWG 502 comprises a memory and associated circuitry for generating a digital representation of an ultrasound transmit waveform In one embodiment, the PWG 502 comprises the circuitry shown in U.S. Pat. No. 6,104,673, the disclosure of which is incorporated herein by reference. For example, a memory, multipliers, delay buffers, adders, and other circuitry generate a digital representation of a modulated bi-polar ultrasound waveform from envelope samples output from the memory. In alternative embodiments, a processor, digital signal processor, application specific integrated circuit, or memory output any subset or entire representation of the bi-polar ultrasound waveform to the DAC 508.

The PWG 502 outputs the digital representation to the DAC 508 on a bus 506. The PWG 502 also outputs a switch control signal on the line 504 to the switch 510. The switch control signal comprises a polarity sign bit. The polarity sign bit distinguishes between positive and negative portions of the digital representation of the bi-polar waveform. For example, the PWG 502 generates a digital representation comprising a unipolar waveform where portions of the unipolar waveforms represent the magnitude (module) of negative and positive portions of the desired bi-polar ultrasound waveform.

The DAC 508 comprises a current output single ended digital-to-analog converter. Other digital-to-analog converters may be used. In one embodiment, the DAC 508 is operable to receive 8 bits of data representing an amplitude at any given time, but different resolutions may be provided. The data on the output bus 506 is converted into an analog ultrasound waveform by the DAC 508.

The switch 510 comprises a high-speed single-pole double-throw analog switch (FET or CMOS), 2-channel multiplexer, a differential amplifier, or other switch device. In this embodiment, the switch includes an input 518 and two outputs 520 and 522. The switch 510 receives the analog waveform from the digital-to-analog converter 508.

The switch 510 also includes a control signal input 524. The polarity information controls the switch 510. In response to the polarity signal, the switch 510 selects between the two outputs 520 and 522. The portion of the waveform representing the positive portion of the desired bi-polar transmit waveform is routed to the first current driver 512, and the portion of the waveform representing the negative portion of the desired bi-polar waveform is routed to the second current driver 514.

The first and second current drivers 512 and 514 receive signals corresponding to positive and negative portions respectively, of the desired bi-polar waveform. Each current driver 512, 514 comprises a closed loop current mirror. In one embodiment, each of the current drivers 512, 514 comprise an operational amplifier 526, 528, two resistors 534, 536, 548 and 550 and a transistor 530, 532. The transistors 530, 532 act as series pass devices. One resistor 548, 550 connected between the switch 510 and ground comprises a load resistor, and another resistor connected between the operational amplifier and ground in a feedback loop comprises a scaling resistor. The gain of the current driver is a function of the ratio of the load resistor to the scaling resistor. In one embodiment, the scaling resistor comprises a low resistance, such as 0.5 to 2 ohms for use with high current, such as a few amps. Other currents and resistances may be used. In one embodiment, unity gain or a gain of 1 is used, but other gains may be provided. The resistors in each of the current drivers 512, 514 are matched to the resistances of the other current driver 512, 514.

The transistors 530, 532 comprise a MOSFET transistor connected in a common gate configuration. In an alternative embodiment, a bipolar transistor in a common base configurations may be used. In other alternative embodiments, different current drivers, such as conventional current mirrors may be provided.

Each current driver 512, 514 comprises a path or channel for driving the output amplifier 516. One path is responsive to waveforms representing the positive portion of the desired bi-polar ultrasound waveform, and the other path is responsive to waveforms representing the negative portion of the desired bi-polar ultrasound waveform. In one embodiment, the input waveforms representing both the positive and negative portions of the bi-polar waveform are unipolar positive waveforms. Alternatively, unipolar negative waveforms may be input.

The output amplifier 516 comprises a Class B push-pull amplifier stage. The output amplifier 516 is a transformer-coupled amplifier, including a transformer 538, two transistors 540, 542 and two voltage supplies 546 and 544.

The transformer 538 may have any winding ratio, such as a 1.5 to 1 step down ratio. The center tap of the primary winding of the transformer 538 is connected with a DC voltage source 546. Since the unipolar waveforms representing respective positive and negative portions of the bi-polar waveform are applied to different sides of the transformer 538, the bi-polar ultrasound waveform is generated at the output of the transformer 538.

The voltage source 546 connected to the transformer 538 comprises a high voltage DC power supply. For example, the voltage source 546 comprises a voltage divider, a battery, or other source of DC voltage. In one embodiment, the voltage source 546 provides about 100 volts, but other higher or lower voltages may be provided.

The transistors 540, 542 comprise MOSFETS or bi-polar junction transistors. Other types of transistors may be used. The transistors 540 and 542 are connected in a common gate (base) configuration. The transistors 540 and 542 are biased by the voltage source 544.

The voltage source 544 connected to the transistors 540, 542 comprises a voltage divider, a battery, or other device for providing biasing DC voltage. In one embodiment, the bias voltage is 10 to 15 volts, but higher or lower biasing voltages may be used.

The transistor 540, 542 of the output amplifier 516 and the transistors 530, 532 of the current drivers 512, 514 comprise two cascode amplifiers. In effect, a cascode amplifier is provided in each of two channels associated with respective ones of the current drivers 512, 514. The cascoded transistors 530, 532, 540, 542 provide a low capacitive load to the operational amplifiers 526, 528, expanding the effective bandwidth of the operational amplifiers 526, 528 or allowing amplifiers with lesser driving capabilities.

The transducer element 517 receives the bi-polar ultrasound waveform from the output amplifier 516. The transducer element 517 comprises a piezoelectric, micro-electromechanical membrane, or other transducer device for converting electrical energy to acoustic energy. In one embodiment, the transducer element 517 is one of an array of transducer elements. Each element of the array is connected with a different output amplifier.

Figure 4A:
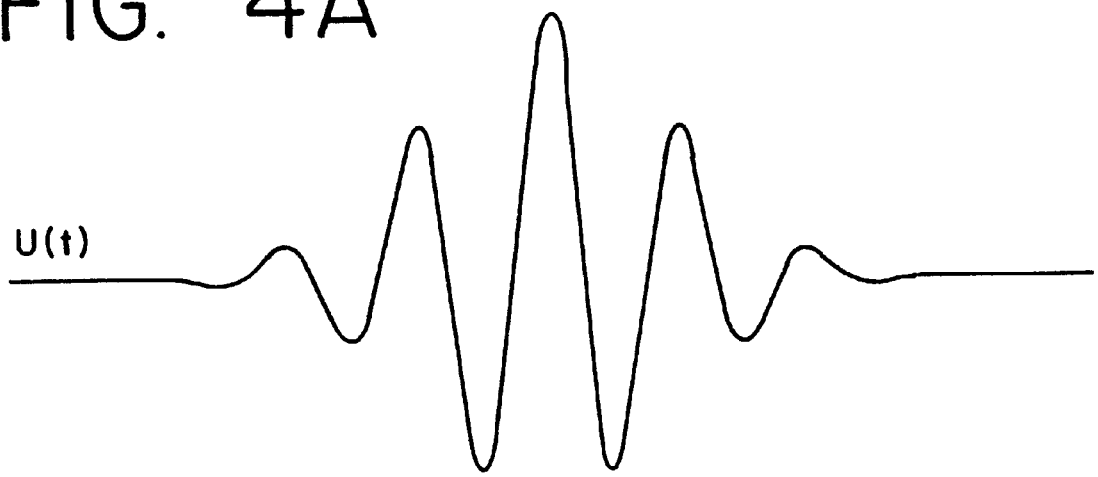
FIG. 4A shows one embodiment of a transmit waveform.
Figure 4B:
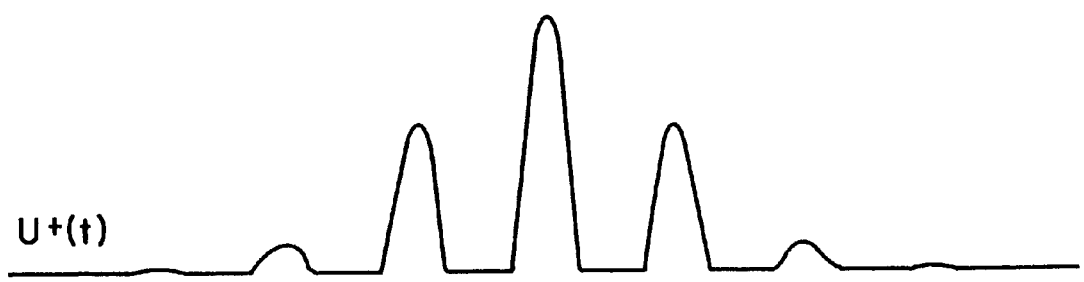
FIGS. 4B and 4C are driving signals for a push-pull Class B stage to produce the waveform shown in FIG. 4A.
Figure 4C:
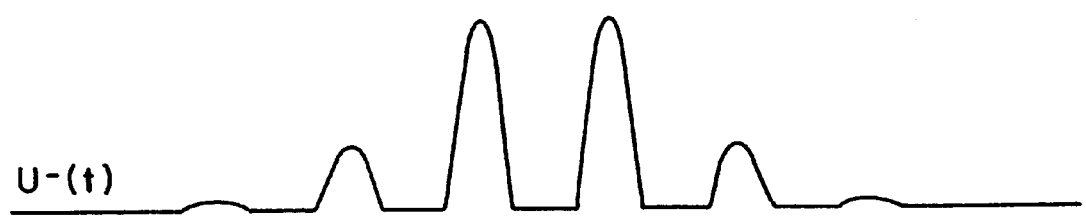
Figure 4D:
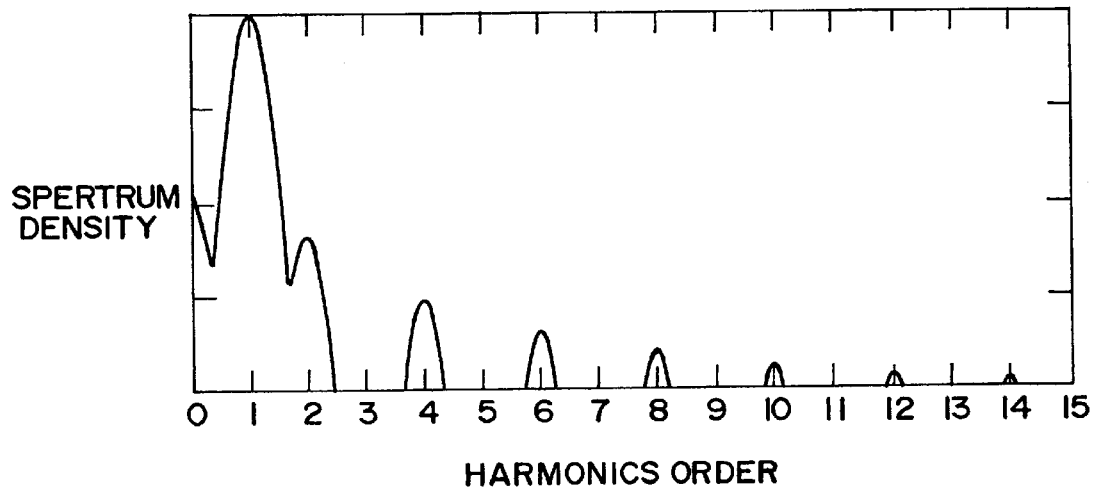
FIG. 4D illustrates distortion of transmit spectrum caused by the gain mismatch using the waveforms of FIGS. 4A–C in the circuit of FIG. 2.
Figure 4E:
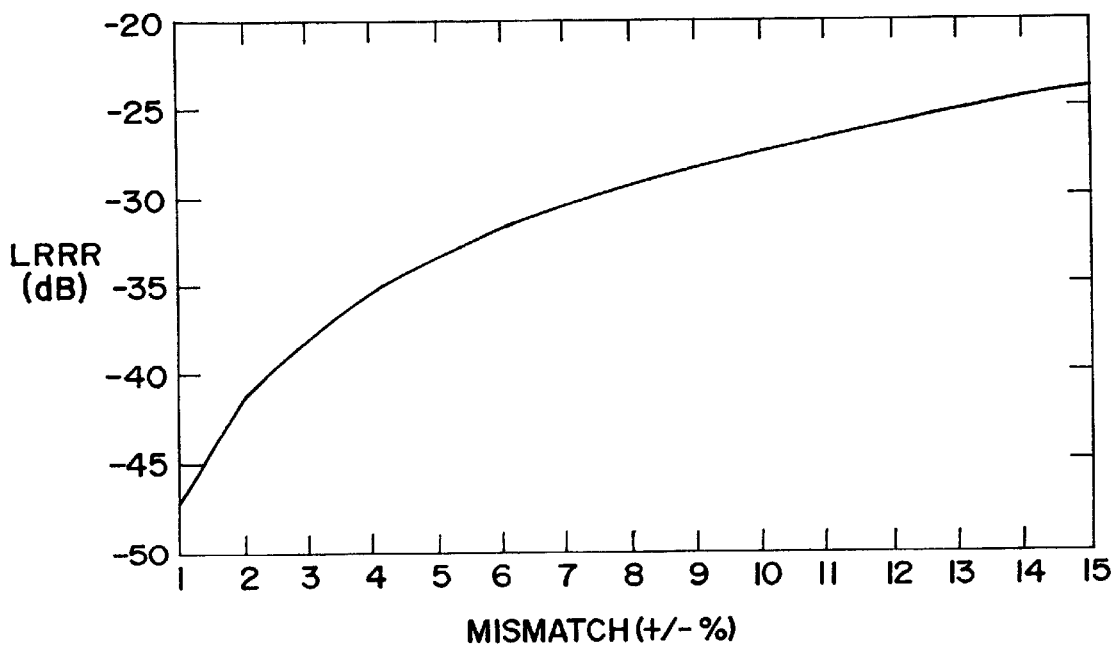
FIG. 4E is a graph of Linear Response Rejection Ratio vs. gain mismatch using the waveforms of FIGS. 4A–C in the circuit of FIG. 2.

In operation, the transmit circuit 500 generates a bi-polar ultrasound waveform, such as shown in FIG. 4A. The unipolar waveforms shown in FIGS. 4B and 4C are combined in the PWG 502 and their superposition provided by the digital-to-analog converter 508. In alternative embodiments, negative unipolar waveforms are generated. The unipolar waveform shown in FIG. 4B represents the positive portions of the desired bi-polar waveform, and the unipolar waveform shown in FIG. 4C represents the negative portions of the desired bi-polar waveform shown in FIG. 4A. Arbitrary waveforms having different envelopes, amplitudes or frequencies may be used.

The PWG 502 generates data corresponding to a unipolar waveform representing the desired bi-polar ultrasound waveform. Bits of data representing magnitude information are provided to the digital-to-analog converter 508. The digital-to-analog converter 508 applies an equivalent analog current to the input terminal 518 of the switch 510.

The switch 510 also receives a sign control bit or indication of the positive or negative portion of the bi-polar waveform represented by the unipolar waveform. In response to this indication, the switch 510 switches between the two outputs 520, 522. For example, the unipolar waveform of FIG. 4B is switched to one current driver 512. The other portion of the unipolar waveform as represented in FIG. 4C is switched to the other current driver 514.

One current driver 512 amplifies the unipolar waveform representing the positive portion of the desired bi-polar waveform, and the other current driver 514 amplifies the unipolar waveform representing the negative portion of the desired bi-polar waveform When not amplifying the current, each current driver 512, 514 is grounded through the loading resistor 548, 550. Both amplified currents are provided to the output amplifier 516.

The output amplifier 516 transforms the two unipolar waveforms into the bi-polar ultrasound waveform shown in FIG. 4A or another bipolar waveform. The unipolar waveform representing the positive portion of the bi-polar waveform is provided to one end of the primary winding of the transformer 538, and the unipolar waveform representing the negative portion of the desired bi-polar waveform is provided to the other end of the primary winding of the transformer 538. Being fed by the voltage source 546 at the center tap of the primary winding, the transformer 538 outputs the desired bi-polar ultrasound waveform.

The closed loop current mirrors or current drivers 512, 514 provide stable and properly matched current gain for both signal paths as a function of the scaling resistors 534, 536. Well matched current gain reduces even order harmonic distortions. By calibrating the resistances of 534, 536, the difference between two paths may be additionally corrected.

Figure 5:
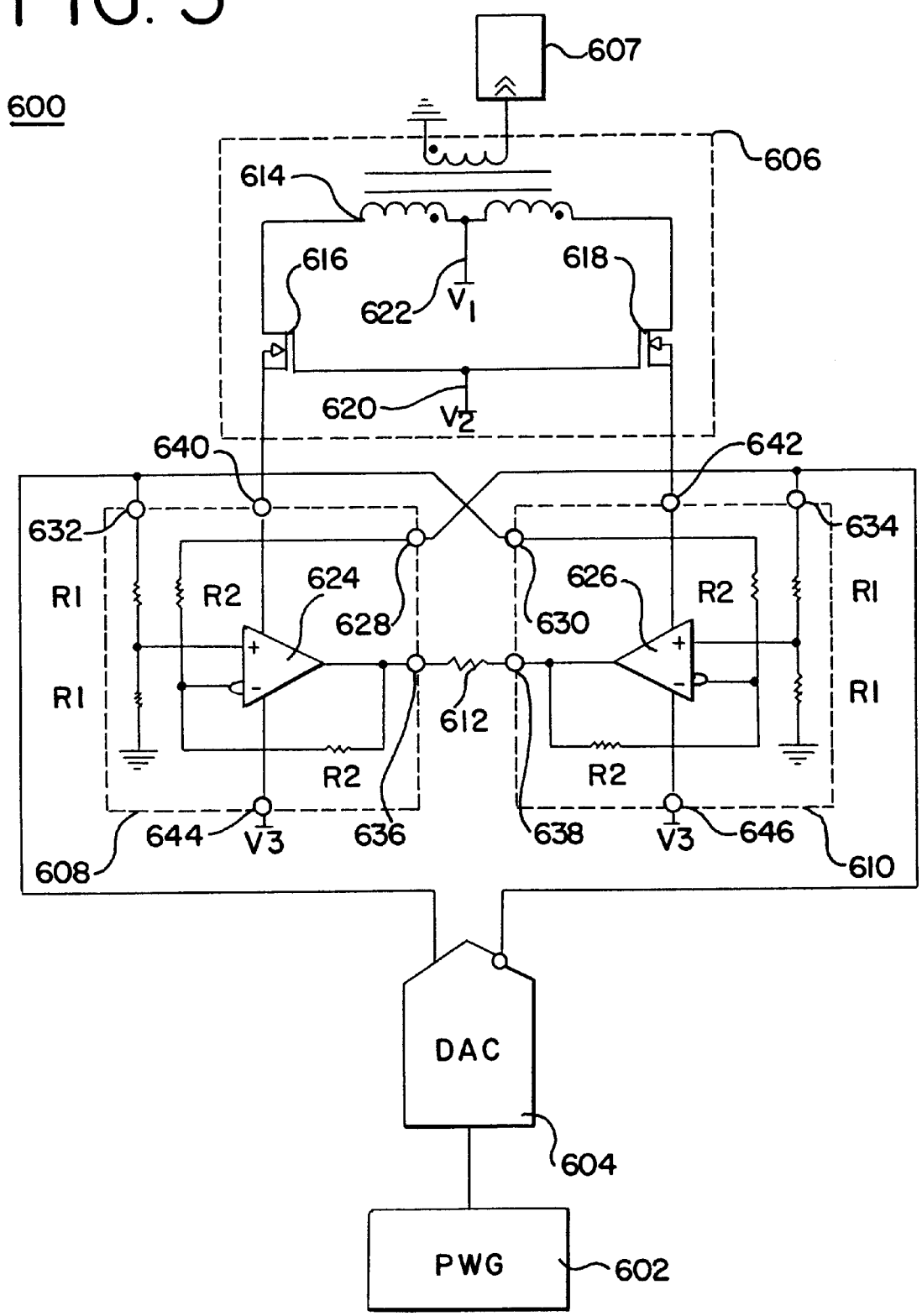
FIG. 5 is a circuit diagram of another embodiment of an ultrasound transmit circuit.

To further reduce even order distortion, topology with a single scaling resistor is provided. One embodiment using a single scaling and a single DAC is shown in FIG. 5. The ultrasound transmit circuit 600 uses similar components as the ultrasound transmit circuit 500 of FIG. 3. The discussion of these common components for FIG. 3 applies to this discussion for FIG. 5. The transmit circuit 600 includes a programmable waveform generator 602, a digital-to-analog converter 604, current drivers 608, 610, a scaling resistor 612, an output amplifier 606, and a transducer element 607. Additional, fewer or different components may be used.

The PWG 602 comprises the circuitry disclosed in U.S. Pat. No. 6,104,673 altered to output digital data representing a bi-polar transmit signal, arranged by an offset binary code. In the analog domain, the bi-polar transmit signal corresponds to an unipolar waveform with a DC offset. Other coding or data representing bipolar signals may be provided.

The DAC 604 comprises a communications DAC or other digital-to-analog converter with two complementary outputs. The complementary outputs comprise differential outputs of the inverse of the same waveform.

Each of the current drivers 608, 610 comprises a difference amplifier. Each difference amplifier comprises an operational amplifier 624, 626 and two pairs of match resistors labeled R1 and R2. In one embodiment, the resistors R1 are about 100 ohms, but other resistance values may be used. The resistors R2 are 100 to 1K ohms, but other resistance values may be used. A unity gain with respect to both the inverted and non-inverted inputs from the digital-to-analog converter 604 is provided. The difference amplifiers comprise level shift circuits converting the differential signal provided by the digital-to-analog converter 604 to a single ended bipolar output relative to the ground.

The inverted output of the digital-to-analog converter 604 is provided as a positive input to one of the operational amplifiers 626 and as a negative input to the other operational amplifier 624. The non-inverted output of the digital-to-analog converter 604 connects to the other inputs of the two operational amplifiers 624, 626. The current drivers include inverted input 628, 630 and non-inverted inputs 632, 634 corresponding to the connections with the operational amplifiers discussed above. With the unity gain, the output 636, 638 of each of the operational amplifiers 624, 626 is zero if both input voltages are equal. For the offset binary code output by the PWG 602, the differential outputs of the DAC 604 have a same voltage or current when the transmitted waveform crosses zero. Given the desired bi-polar waveform, the conventional outputs 636, 638 of the difference amplifiers of the current drivers 608, 610 comprise bi-polar waveforms centered around 0. Since the current driver 608 and 610 are driven in reverse, their conventional outputs 636, 638 are in opposite polarity.

The scaling resistor 612 connects between the conventional outputs 636 and 638 of the operational amplifiers 624, 626. In one embodiment, a resistor with 1 to 5 ohms of resistance is directly connected between the outputs 636, 638. In alternative embodiments, different resistances or additional network elements may be connected with the scaling resistor 612. The single scaling resistor 612 or network provide a same transfer function for each of the current driver 608, 610.

The operational amplifiers 624 and 626 include positive supply nodes 640 and 642 and negative supply nodes 644 and 646. The negative supply node 644 and 646 are connected to a common voltage source or different voltage sources providing a same or substantially same voltage. The positive supply nodes 640, 642 are connected to drive the output amplifier 606. In alternative embodiments, the negative supply nodes 644, 646 connect with the output amplifier 606, and the positive supply node 640, 642 connect with a common voltage source.

The positive supply nodes 640, 642 comprise bias ports that provide oppositely phased current signals to drive the output amplifier 606. The operational amplifiers 624, 626 separate their output current into positive and negative components using complementary Class B output stages. Positive and negative components of the input waveform are separated onto respective positive and negative supply nodes 640, 642, 644, 646. The magnitude of the current is responsive to the resistance of the scaling resistor 612. Since the output 636, 638 of the operational amplifier 624 and 626 are in reverse or opposite phase of each other, the positive supply nodes 640 and 642 drive a pair of in-phase current signals associated with positive and negative portions of the desired bi-polar ultrasound waveform.

The output amplifier 606 receives the driving current signals that are equalized for gain and phase in response to the two substantially identical closed loop difference amplifiers of the current driver 608 and 610. In response, the output amplifier 606 generates the desired bi-polar ultrasound waveform. The ultrasound waveform is provided to the transducer element 607 for transmission of acoustic energy.

The scaling resistor 612 scales the current provided to the output amplifier 606 and provides more efficient matching of the gain of the two current driver 608 and 610. Using a single digital-to-analog converter 604 and the scaling resistor 612 connected with both current drivers 608 and 610, even order distortion generated by the transmit circuit 600 is reduced.

While the invention has been described above by reference to various embodiments, it would be understood that many changes and modifications can be made without departing from the scope of the invention. For example, different current drivers or output amplifier configurations may be used. Different digital waveforms generators may be used for providing a digital representation to the digital-to-analog converter. Additional amplifiers and transistors may also be used.

It is therefore intended that the foregoing detailed description be understood as an illustration of the presently preferred embodiments of the invention, and not as a definition of the invention. It is only the following claims or added claims, including all equivalents, that are intended to define the scope of this invention.

What is claimed is:

1. An ultrasound transmit circuit for generating a bi-polar waveform, the circuit comprising:
    an output amplifier;
    first and second current drivers operatively connected with the output amplifier;
    a digital-to-analog converter; and
    a switch operable to connect an ultrasound waveform output of the digital-to-analog converter with a selectable one of the first and second current drivers.

2. The circuit of claim 1 wherein the output amplifier comprises a transformer-coupled class B push-pull amplifier.

3. The circuit of claim 1 wherein the output amplifier comprises a transformer connected with first and second transistors, the first and second transistors connected with the first and second current drivers, respectively.

4. The circuit of claim 1 wherein each of the first and second current drivers comprise an operational amplifier and a transistor.

5. The circuit of claim 4 wherein the first and second current drivers further comprise first and second pairs of resistors, respectively, a gain of each of the first and second current drivers responsive to resistances of the respective two resistors.

6. The circuit of claim 1 wherein each of the first and second current drivers comprise a closed loop current mirror.

7. The circuit of claim 1 wherein the switch comprises a single-pole double-throw switch.

8. The circuit of claim 1 further comprising a programmable waveform generator having an output connected with the digital-to-analog converter and a switch control output connected with the switch.

9. The circuit of claim 1 wherein the switch selectably routes the output of the digital-to-analog converter as a function. of a polarity of the bi-polar waveform.

10. The circuit of claim 1 wherein the output amplifier comprises a first transistor connected with a second transistor, the second transistor in the first current driver, the first and second transistors comprising a cascode amplifier.

11. An ultrasound transmit circuit for generating a bi-polar ultrasound waveform, the circuit comprising:
    a digital-to-analog converter; and
    a switch connected to selectably route an ultrasound waveform output of the digital-to-analog converter as a function of a polarity of the bi-polar ultrasound waveform.

12. The circuit of claim 11 further comprising first and second current drivers connected with the switch to receive the output of the digital-to-analog converter, the first current driver connected to receive a signal representing a positive portion of the bi-polar waveform and the second current driver connected to receive a signal representing a negative portion of the bi-polar waveform.

13. The circuit of claim 12 further comprising an output amplifier connected with the first and second current drivers.

14. The circuit of claim 11 wherein the switch comprises a single-pole double-throw switch.

15. The circuit of claim 11 further comprising a programmable waveform generator operable to output a digital representation of the bi-polar waveform as a uni-polar waveform and a polarity sign bit to the switch.

16. A method for generating a bi-polar ultrasound waveform with an ultrasound transmit circuit, the method comprising:
    (a) converting a digital uni-polar waveform representation of the bi-polar ultrasound waveform to an analog waveform;
    (b) indicating positive and negative portions of the bi-polar ultrasound waveform represented by the uni-polar waveform; and
    (c) switching an output responsive to (a) as a function of (b).

17. The method of claim 16 wherein (c) comprises switching the output to first and second current drivers, the first current driver receiving the analog waveform corresponding to negative portions and the second current driver receiving the analog waveform corresponding to the positive portions.

18. The method of claim 16 further comprising:
    (d) amplifying the positive and negative portions of the uni-polar waveform representation of the bi-polar ultrasound waveform; and
    (e) transforming the positive and negative portions of the uni-polar waveform representation of the bi-polar ultrasound waveform into the bi-polar ultrasound waveform.

19. An ultrasound transmit circuit for generating a bi-polar waveform, the circuit comprising:
    an output amplifier;
    first and second current drivers operatively connected with the output amplifier;
    a resistor connected between the first and second current drivers; and
    an ultrasound transducer connected with the output amplifier.

20. The circuit of claim 19 wherein the output amplifier comprises a transformer-coupled class B push-pull amplifier.

21. The circuit of claim 19 wherein the output amplifier comprises a transformer connected with first and second transistors, the first and second transistors connected with the first and second current drivers, respectively.

22. The circuit of claim 19 wherein the first and second current drivers comprise first and second difference amplifiers, respectively.

23. The circuit of claim 22 wherein a positive input of the first difference amplifier connects with a negative input of the second difference amplifier and a positive input of the second difference amplifier connects with a negative input of the first difference amplifier.

24. The circuit of claim 22 wherein the resistor connects with conventional outputs of the first and second difference amplifiers, respectively.

25. The circuit of claim 22 wherein first and second supply nodes of the first and second difference amplifiers, respectively, connect with the output amplifier.

26. The circuit of claim 25 wherein third and fourth supply nodes of the first and second difference amplifiers, respectively, connect with a voltage source, the output amplifier comprises first and second transistors connected with the first and second supply nodes, respectively.

27. The circuit of claim 22 wherein the first and second difference amplifiers comprise first and second unity gain difference amplifiers, respectively.

28. The circuit of claim 22 further comprising a digital-to-analog converter having differential outputs, both of the differential outputs connected with both of the first and second differential amplifiers.

29. The circuit of claim 19 wherein the resistor connects directly to the outputs of the first and second current drivers.

30. An ultrasound transmit circuit for generating a bi-polar waveform, the circuit comprising:

an output amplifier having first and second inputs;

first and second difference amplifiers having respective first and second supply nodes connected with the first and second inputs, respectively; and an ultrasound transducer connected with the output amplifier.

31. The circuit of claim 30 wherein the output amplifier comprises a transformer connected with first and second transistors, the first and second transistors connected with the first and second inputs, respectively.

32. The circuit of claim 30 wherein a positive input of the first difference amplifier connects with a negative input of the second difference amplifier and a positive input of the second difference amplifier connects with a negative input of the first difference amplifier.

33. The circuit of claim 30 wherein a resistor connects between conventional outputs of the first and second difference amplifiers.

34. The circuit of claim 30 further comprising a digital-to-analog converter having differential outputs, both of the differential outputs connected with both of the first and second differential amplifiers.

35. A method for generating a bi-polar ultrasound waveform with an ultrasound transmit circuit, the method comprising:

(a) driving an output amplifier with first and second difference amplifiers;

(b) scaling the supply currents of the first and the second difference amplifiers as a function of a resistor connected between the outputs of said difference amplifiers; and (c) generating the bi-polar ultrasound waveform in response to (a).

36. The method of claim 35 wherein (a) comprises driving a transformer-coupled class B output amplifier with the supply currents from the first and second difference amplifiers.

37. The method of claim 35 wherein (b) comprises matching the gain of the first and second difference amplifiers.

38. A method for generating a bi-polar ultrasound waveform with an ultrasound transmit circuit, the method comprising:

(a) amplifying first and second uni-polar waveforms;

(b) driving (a) with supply node currents of first and second difference amplifiers; and (c) generating the bi-polar ultrasound waveform in response to (a).

39. The method of claim 38 further comprising:

(d) scaling the supply node currents of the first and the second difference amplifiers as a function of a resistor connected between the outputs of said difference amplifiers.

* * * * *